(12) United States Patent
Wu

(10) Patent No.: US 7,304,323 B2
(45) Date of Patent: Dec. 4, 2007

(54) TEST MASK STRUCTURE

(75) Inventor: Wen-Bin Wu, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/732,370

(22) Filed: Dec. 11, 2003

(65) Prior Publication Data

US 2005/0127356 A1    Jun. 16, 2005

(51) Int. Cl.
*H01L 23/58* (2006.01)
*H01L 29/10* (2006.01)

(52) U.S. Cl. .................... 257/48; 257/E21.036; 430/30

(58) Field of Classification Search ................. 257/48, 257/E21.036, E21.039, 49; 430/30, 5, 22; 716/20
See application file for complete search history.

(56) References Cited

U.S. PATENT DOCUMENTS

| 6,279,147 | B1 * | 8/2001 | Buynoski et al. ............. 716/19 |
| 6,335,560 | B1 | 1/2002 | Takeuchi .................... 257/620 |
| 6,737,205 | B2 * | 5/2004 | Maltabes et al. ............. 430/22 |
| 2001/0003054 | A1 | 6/2001 | Sumitani .................... 438/401 |
| 2003/0229880 | A1 * | 12/2003 | White et al. ................. 716/19 |

FOREIGN PATENT DOCUMENTS

| JP | 01186617 A | 7/1989 |
| JP | 01251631 A | 10/1989 |
| JP | 09311432 A | 12/1997 |
| JP | 2001044285 A | 2/2001 |
| JP | 2003007678 A | 1/2003 |
| WO | WO 01/20646 A2 | 3/2001 |

* cited by examiner

*Primary Examiner*—Caridad Everhart
(74) *Attorney, Agent, or Firm*—Bacon & Thomas, PLLC

(57) ABSTRACT

Disclosed is a test mask structure. The test mask structure of the present invention comprises at least an array pattern region, in a certain proportion to the final product, having a first pattern density according to the certain proportion; and at least one test mask pattern region having a second pattern density. In the test mask structure of the present invention, the required pattern density is obtained by adjusting the area of the array pattern region and the area of the test mask pattern region according to the first pattern density and the second pattern density.

8 Claims, 1 Drawing Sheet

TEST MASK STRUCTURE

BACKGROUND OF THE INVENTION

1. Field of the Invention

The present invention relates to a semiconductor device process, more specifically, to a test mask structure, which is able to promote etching accuracy.

2. Description of the Prior Art

In the semiconductor device process, the formation of the respective parts of the integrated circuit frequently utilizes mask etch techniques. However, in the respective steps of pattern setting, mask producing, exposing, developing, imaging and etching, due to the material and errors from practical operation, predetermined critical dimension cannot be maintained a hundred percent in each step. Taking a pattern of 180 nm critical dimension as an example, the critical dimension is set as 180 nm in the initial layout. However, in consideration of the possible errors, which may occur in the subsequent process, when making a mask, the critical dimension is maintained as 180 nm in high pattern density portion, while the critical dimension is increased to 200 nm in middle density portion and increased to 220 nm in low density portion, so as to expect the critical dimension in the respective portions of different pattern densities for a final etched pattern can be maintained as 180 nm. However, in the final etched pattern, it is possible that the critical dimension in the middle density portion is 190 nm, and the critical dimension in the low density portion is 200 nm. Accordingly, it is necessary to adjust the settings for the critical dimension in the respective portions. For example, the critical dimension is respectively adjusted to 190 nm and 200 nm for the middle density portion and the low density portion of the mask. To properly determine the required critical dimension settings for producing masks, it is necessary to perform testing using a test mask before production so as to get the data of the errors generated during the interval from applying a mask to completing etching.

FIG. 1 illustrates a conventionally used test mask structure. The pattern density distribution of the conventional test mask is gradually from high to low from one side to the other side. For a 110 nm test mask, the average density of the entire test mask is 32.2%.

However, for a practical product of 110 nm dimension, the pattern density is about 50%, usually 45~48%. Due to the difference between the pattern densities, the margin adjustment made base on the data obtained by using the test mask is not sufficiently accurate, causing the profile of the final etched product degraded.

Therefore, there is a need for a solution to overcome the problems stated above. The present invention satisfies such a need.

SUMMARY OF THE INVENTION

An objective of the present invention is to provide a test mask structure, in which the area ratio of the respective regions is determined to achieve the required pattern density.

According to an aspect of the present invention, a test mask structure comprises at least an array pattern region in a certain proportion to a final product, the array pattern region having a first pattern density according to the certain proportion. The test mask structure further comprises at least one test mask region having a second pattern density. The areas of the array pattern region and the test mask region are adjusted according to the first and second pattern densities, so as to obtain a required pattern density.

According to another aspect of the present invention, the test mask region in the test mask structure is in a cross shape. The array pattern region comprises four portions distributed around the cross-shaped test mask region.

According to a further aspect of the present invention, the areas of the array pattern region and the test mask region in the test mask structure are determined according to the following equation:

required pattern density=[(ratio of array pattern region area to total area of the structure)×(first density)]+[(ratio of test mask region area to total area of the structure)×(second density)].

BRIEF DESCRIPTION OF THE DRAWINGS

The following drawings are only for illustrating the mutual relationships between the respective portions and are not drawn according to practical dimensions and ratios. In addition, the like reference numbers indicate the similar elements.

DETAILED DESCRIPTION OF THE PREFERRED EMBODIMENT

An embodiment of the present invention will be described in detail with reference to the accompanying drawings.

In accordance with an embodiment of the present invention, a novel test mask structure utilizes at least one array pattern region, which is of a ratio 1:1 with respect to a final product, and at least one conventional test mask pattern region, the regions being arranged into a certain area ratio combination to obtain a required pattern density.

Figure 1:
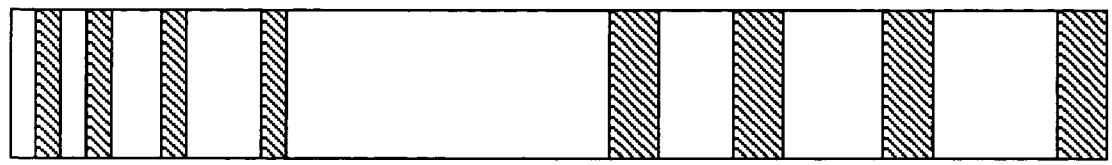
FIG. 1 is a schematic diagram showing a conventional test mask.
Figure 2:
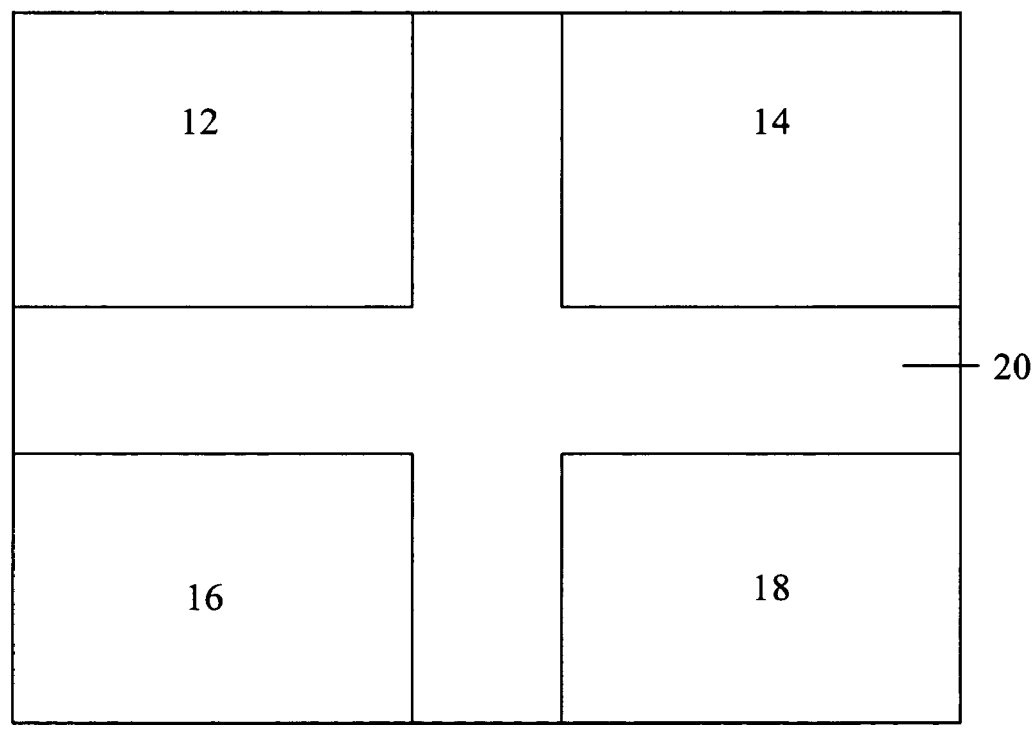
FIG. 2 is a schematic diagram showing a test mask structure in accordance with an embodiment of the present invention.

As shown in FIG. 2, the test mask structure comprises array pattern regions 12, 14, 16, and 18, which is in 1:1 critical dimension ratio with respect to the final product. Since the ratio of the critical dimension to the line pitch is 1:1, the pattern density of the array pattern regions is 50%. A cross region in the structure is a test mask pattern region 20, which utilizes a ready-made test mask with a known pattern density. By controlling the ratio of the total area of the array pattern regions 12, 14, 16, 18 to the area of the test mask pattern region 20, the required pattern density can be obtained. The equation is as follows:

$$D_o = D_p \times [A_p/(A_p+A_m)] + D_m \times [A_m/(A_p+A_m)] \quad (1)$$

Wherein $D_o$ is the required pattern density;

$D_p$ is the pattern density of the array pattern region, herein 50% for this embodiment;

$D_m$ is the pattern density of the conventional test mask pattern region;

$A_p$ is the area of the array pattern region, herein the total area of the array pattern regions 12, 14, 16, 18;

$A_m$ is the area of the conventional test mask pattern region, herein the area of the region 20.

For 110 nm critical dimension product, the pattern density of the conventional test mask pattern region 20 is 32%. The array pattern regions 12, 14, 16, 18 are of 1:1 ratio with respect to the final product. If the required pattern density of the final product is 48%, then $$48\% = 50\% \times [A_p/(A_p+A_m)] + 32\% \times [A_m/(A_p+A_m)] \quad (2)$$

From the above equation, the ratio of the total area of the array pattern regions 12, 14, 16, 18 to the area of the conventional test mask pattern region 20 can be determined.

Although in the present embodiment, the conventional test mask pattern region 20 is of a cross shape, and the array pattern regions 12, 14, 16, 18 are arranged around the test mask pattern region 20, the test mask pattern region and the array pattern regions can be arranged as any other proper arrangement.

While the embodiment of the present invention is illustrated and described, various modifications and alterations can be made by persons skilled in this art. The embodiment of the present invention is therefore described in an illustrative but not restrictive sense. It is intended that the present invention may not be limited to the particular forms as illustrated, and that all modifications and alterations which maintain the spirit and realm of the present invention are within the scope as defined in the appended claims.

What is claimed is:

1. A mask structure comprising:
    at least one array pattern region of which the critical dimension and pitch are in a predetermined proportion to a final product having a required pattern density, the at least one array pattern region having a first pattern density based on said predetermined proportion and a first dimension; and
    at least one test mask pattern region having a second pattern density and a second dimension,
    wherein a proportion of the first dimension to the second dimension is determined according to the first pattern density, the second pattern density, and the required pattern density.

2. The mask structure as claimed in claim 1, wherein the structure has a test mask pattern region of cross shape, and four array pattern regions arranged around the test mask pattern region.

3. The mask structure as claimed in claim 1, wherein the proportion of the first dimension to the second dimension is determined according to the following equation:

required pattern density=[(ratio of the first dimension to a total dimension of the structure)×(first density)]+[(ratio of the second dimension to the total dimension of the structure)×(second density)].

4. The mask structure as claimed in claim 1, wherein the test mask pattern region uses a ready-made test mask.

5. A method of forming a mask structure, comprising the steps of:
    forming at least one array pattern region of which the critical dimension and pitch are in a predetermined proportion to a final product having a required pattern density, the at least one array pattern region having a first pattern density based on said predetermined proportion and a first dimension;
    forming at least one test mask pattern region having a second pattern density and a second dimension; and
    determining a proportion of the first dimension to the second dimension according to the first pattern density, the second pattern density, and the required pattern density.

6. The method as claimed in claim 5, wherein the structure if formed to have a test mask pattern region of cross shape, and four array pattern regions arranged around the test mask pattern region.

7. The method as claimed in claim 5, wherein the proportion of the first dimension to the second dimension is determined according to the following equation:

required pattern density=[(ratio of the first dimension to a total dimension of the structure)×(first density)]+[(ratio of the second dimension to the total dimension of the structure)×(second density)].

8. The method as claimed in claim 5, wherein the test mask pattern region uses a ready-made test mask.

* * * * *